(12) United States Patent
Tchamov et al.

(10) Patent No.: US 7,701,303 B2
(45) Date of Patent: Apr. 20, 2010

(54) OSCILLATOR WITH DARLINGTON NODES

(75) Inventors: Nikolay Tchamov, Tampere (FI); Pekko Ruippo, Tampere (FI); Tapio Lehtonen, Tampere (FI)

(73) Assignee: Infineon Technologies AG, Neubiberg (DE)

( * ) Notice: Subject to any disclaimer, the term of this patent is extended or adjusted under 35 U.S.C. 154(b) by 89 days.

(21) Appl. No.: 11/617,963

(22) Filed: Dec. 29, 2006

(65) Prior Publication Data

US 2008/0157891 A1 Jul. 3, 2008

(51) Int. Cl.
*H03B 5/12* (2006.01)
(52) U.S. Cl. ............................ 331/117 FE; 331/177 V; 331/185
(58) Field of Classification Search ............... 331/36 C, 331/117 FE, 117 R, 177 V, 108 R, 115, 185, 331/186
See application file for complete search history.

(56) References Cited

U.S. PATENT DOCUMENTS

| | | | | | |
|---|---|---|---|---|---|
| 2,663,806 | A | * | 12/1953 | Darlington | 327/483 |
| 3,582,824 | A | * | 6/1971 | Lencioni, Jr. | 331/109 |
| 3,816,809 | A | * | 6/1974 | Kuster | 363/21.15 |
| 3,916,297 | A | * | 10/1975 | Mastner | 323/355 |
| 4,168,840 | A | * | 9/1979 | Graham | 280/6.157 |
| 4,565,978 | A | * | 1/1986 | Fenk et al. | 331/117 R |
| 5,714,915 | A | * | 2/1998 | Brilka | 331/117 R |
| 5,801,591 | A | * | 9/1998 | Parrott | 331/96 |
| 7,164,325 | B2 | * | 1/2007 | Aparin et al. | 331/176 |

OTHER PUBLICATIONS

Edgar Sanchez-Sinencio, Andreas G. Andreou, "Low-Voltage/Low-Power Integrated Circuits and Systems", Wiley-IEEE Press, 1998, Ch. 9.
Yue Wu, V. Aparin, "A Monolithic Low Phase Noise 1.7GHz CMOS VCO for Zero-IF Cellular CDMA Receivers", IEEE Solid-State, Circuit Conf. 2004.
E. Hegazi, H. Sjoland, A. Abidi, "A Filtering Technique to Lower LC Oscillator Phase Noise", IEEE J. Solid State Circuits, vol. 36, No. 12, pp. 1921-1930, Dec. 2001.
Ghandhi, S., "Darlington's Compound Connection for Transistors," IRE Trasactions on Circuit Theory, vol. 4, issue 3, pp. 291-292, Sep. 1957.

* cited by examiner

*Primary Examiner*—Robert Pascal
*Assistant Examiner*—Levi Gannon
(74) *Attorney, Agent, or Firm*—Edell, Shapiro & Finnan, LLC

(57) ABSTRACT

A voltage-controlled oscillator has a resonance tank core providing a voltage-dependent resonance frequency, switching units connected with the resonance tank core for changing output voltage levels of the oscillator with a frequency corresponding to the resonance frequency of the resonance tank core. At least two of the switching units have pairs of Darlington transistors which are connected via a Darlington node. Output terminals are used for outputting the output voltage levels.

24 Claims, 7 Drawing Sheets

US 7,701,303 B2

OSCILLATOR WITH DARLINGTON NODES

TECHNICAL FIELD

The present invention relates to an oscillator, and in particular relates to a voltage-controlled oscillator which is used e.g. in circuit arrangements, in which a controllable frequency has to be provided.

BACKGROUND

The supply voltage for such an oscillator circuit is conventionally chosen regarding the signal-to-noise ratio. The signal-to-noise ratio in turn influences the frequency stability of the oscillator circuit. A high supply voltage typically results in an improved signal-to-noise ratio. By using a high supply voltage conventionally high voltage transistors have to be employed in the oscillator circuit. High voltage transistors, however, have the major disadvantage that they usually exhibit much lower operation speeds than transistors operating with a lower supply voltage. A disadvantage of using low-voltage high-speed transistors is that they exhibit a lower signal-to-noise ratio than high-voltage transistors.

SUMMARY

The present invention provides a voltage-controlled oscillator which comprises a resonance tank core providing a voltage-dependent resonance frequency, switching units connected to the resonance tank core for changing output voltage levels of the oscillator with a frequency corresponding to the resonance frequency of the resonance tank core wherein at least two of the switching circuits comprise a pair of Darlington transistors which are connected via a Darlington node, and output terminals for outputting the output voltage levels.

Thus a voltage-controlled oscillator circuit is provided which allows a low signal-to-noise ratio and which is capable of operating with low-voltage transistors.

BRIEF DESCRIPTION OF THE DRAWINGS

Embodiments of the present invention are depicted in the drawings and are explained in more detail in the following description. In the drawings like elements bear like reference numerals. In the drawings.

In the drawings like elements bear like reference numerals.

DETAILED DESCRIPTION

Figure 1:
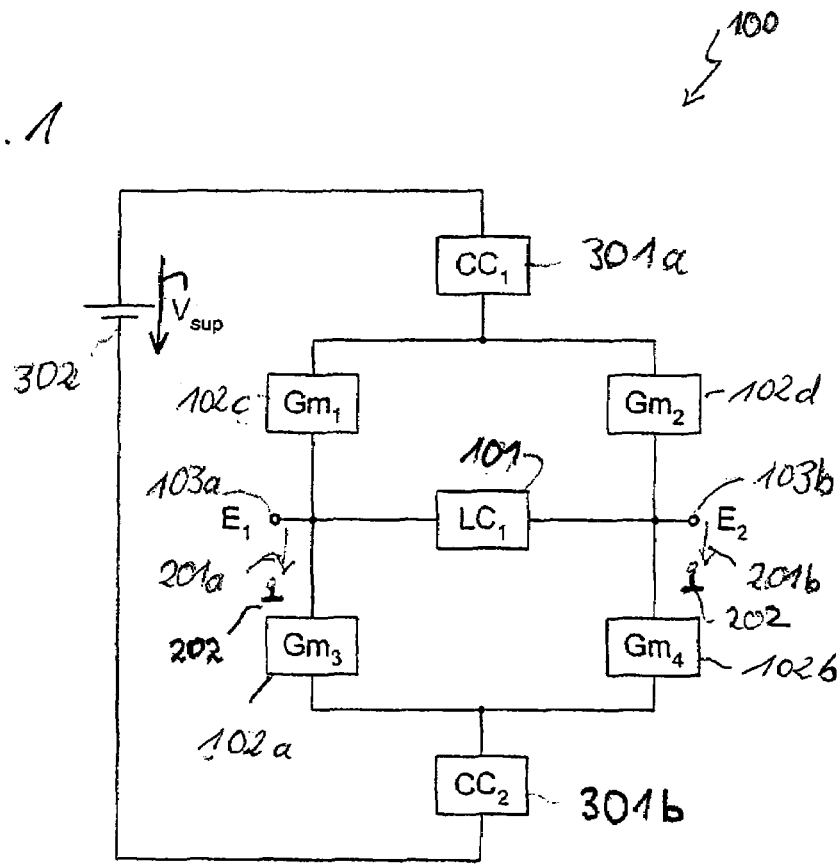
FIG. 1 is a functional block diagram of a voltage-controlled oscillator circuit for explaining the principle of the present invention.
Figure 8:
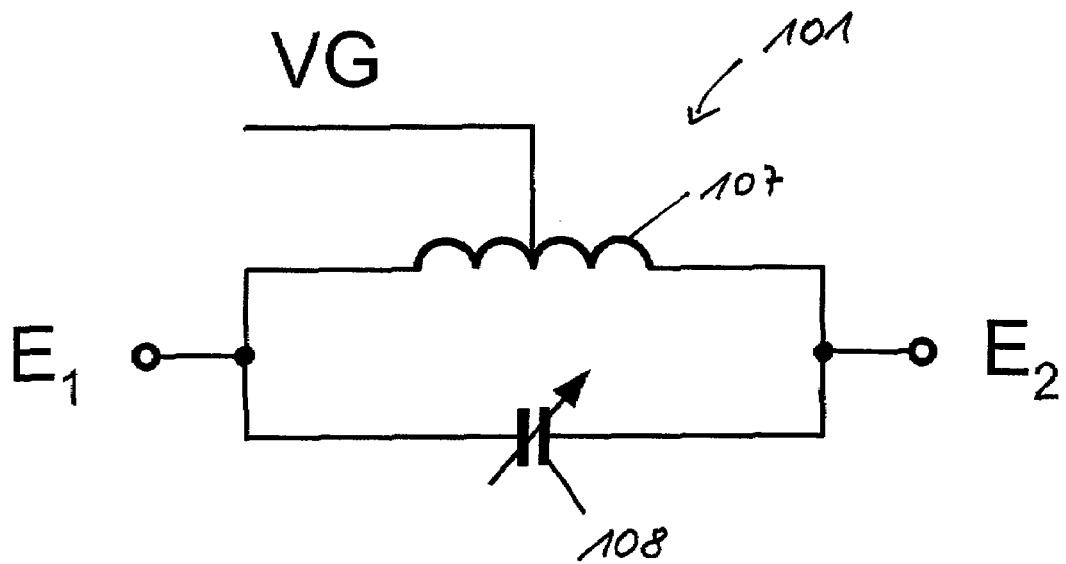
FIG. 8 is a circuit diagram of a resonance tank core.

FIG. 1 exhibits a functional block diagram of an embodiment of a voltage-controlled oscillator circuit showing the principal circuit arrangement. A main component of the voltage-controlled oscillator circuit 100 depicted in FIG. 1 is a resonance tank core 101 which, for example, in one embodiment comprises one inductor 107 and a variable capacitor 108, the capacity of which is adjustable by means of a supplied voltage (FIG. 8).

The voltage-controller oscillator 100 comprises a power supply unit 302 which provides a supply voltage $V_{sup}$ for the whole circuit arrangement. Four amplifying switching units 102a, 102b, 102c and 102d are connected in a bridge circuit-type arrangement, wherein the bridge diagonal branch is formed of the resonance tank core 101. Differential pairs of amplifying switching units are formed by Gm1, Gm2 and Gm3, Gm4, respectively.

Thus, in one embodiment, a voltage-controlled oscillator is provided comprising a resonance tank core which provides a voltage-dependent resonance frequency and switching units connected to the resonance tank core for changing output voltage levels of the oscillator with a frequency corresponding to the resonance frequency of the resonance tank core.

The voltage-controlled oscillator 100 depicted in FIG. 1 can be viewed as a fast inverter including amplifying switching units 102a and 102c which are cross-coupled to a second inverter including amplifying switching units 102b and 102d. The tunable resonance tank core 101 couples the output of each of the inverters back to its input. Furthermore, two output terminals 103a, 103b are provided for outputting output voltage levels which change in accordance with the resonance frequency of the resonance tank core 101.

The output voltage levels are designated by reference numerals 201a and 201b, respectively, showing a potential difference between the respective output terminal 103a, 103b and ground potential 202. Current control units 301a, 301b are connected in series to the bridge-type oscillator circuit, wherein, in one embodiment, the current control units 301a, 301b can comprise single or multiple transistor current mirrors with or without joined combination of filtering group. Furthermore, the current control units 301a, 301b can be single resistors and/or inductors.

Thus, the oscillator circuit comprises control nodes, input nodes and output nodes, wherein the nodes do not interfere directly with the sensitive resonance tank core.

A main aspect of using current control units is to provide a sufficient common mode rejection ratio (CMRR) of the differential pairs formed by the amplifying switching units 102a, 102b and 102c, 102d. The amplifying switching units 102a-102d can be viewed as negative resistances, i.e. amplifying transistors. According to an embodiment, preferably, the amplifying transistors are provided in pairs, one pair 102a, 102b comprising transistors of a predetermined conductivity type and the other pair 102c, 102d comprising transistors of the opposite conductivity type (P- or N-bipolar type, PMOS- OR NMOS-type, etc.).

It is to be noted that the complete supply voltage $V_{sup}$ is applied to each of the amplifying switching units 102a-102d combined with the instant voltage over the resonance tank core 101 ($LC_1$ resonance tank).

Figure 2:
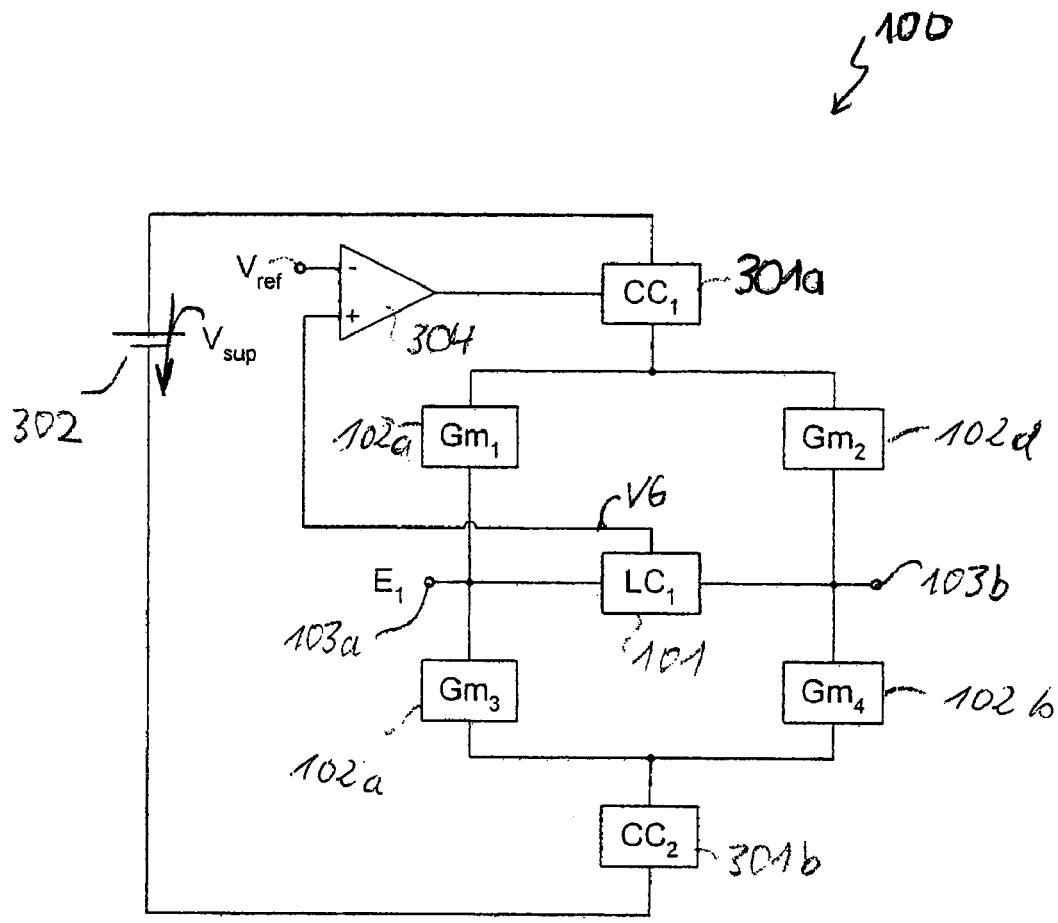
FIG. 2 is a functional block diagram of a modified voltage-controlled oscillator circuit having a temperature compensation and voltage stabilization unit.

FIG. 2 illustrates a functional block diagram of an embodiment of a voltage-controlled oscillator 100 corresponding to the oscillator circuit shown in FIG. 1 and having an additional circuit component in the form of a control unit 304. The control unit 304 essentially comprises a differential amplifier which is provided, at its inverting input, with a reference voltage $V_{rf}$ depending e.g. on an operating temperature of the voltage-controlled oscillator 100. The control unit 304 controls the current control unit 301a in such a way that a comparison of the reference voltage $V_{ref}$ with a virtual ground VG is used as a control signal. The virtual ground VG is derived from the resonance tank core 101, e.g. from a midpoint of the inductor provided in the resonance tank core 101. The output of the control unit 304 controls a bias transistor (see FIG. 4) of the current control unit 301*a* that supplies the biased current to the inverters through an RF choke $L_3$.

It is to be noted that in a circuit arrangement according to FIG. 1 or FIG. 2, one would assume that a trade-off has to be made concerning the selection of components for the amplifying switching units 102*a*, 102*b* and 102*c*, 102*d*. As described above, the increase of a supply voltage increases the signal-to-noise ratio and the frequency stability, whereas low-voltage transistors exhibit higher operation speeds.

Figure 3:
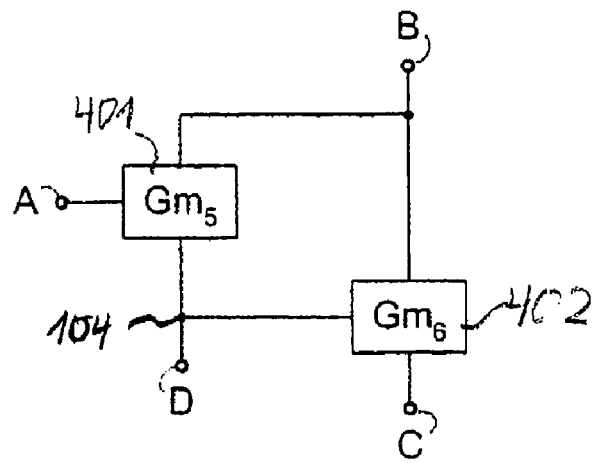
FIG. 3(a) is a functional block diagram of a Darlington-type circuit arrangement.
FIG. 3(b) shows the Darlington-type circuit arrangement of FIG. 3(a) in more detail.
Figure 3:
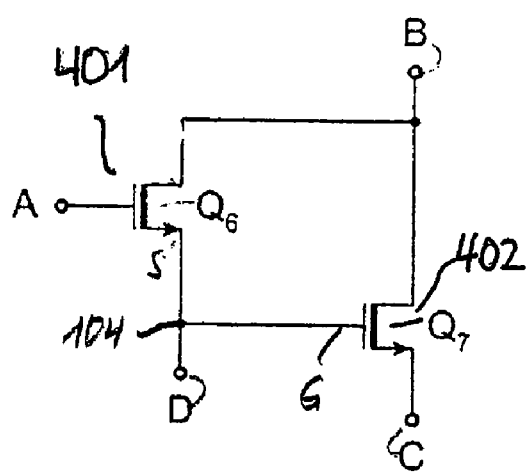

FIGS. 3(*a*) and 3(*b*) illustrate the circuit arrangement comprising a Darlington transistor pair. As shown in FIG. 3(*a*), a first Darlington transistor 401 is interconnected with a second Darlington transistor 402. In FIG. 3(*a*), "A" designates a control input, wherein "B" and "C" designate a switching connection. A Darlington node is designated by "D" and is used to connect the output of the first Darlington transistor 401 with the input of the second Darlington transistor 402.

In a Darlington transistor pair which is used as a single unit, the current amplified by the first Darlington transistor 401 is amplified further by the second Darlington transistor 402 resulting in a high current gain. A Darlington transistor per unit behaves like a single transistor with a very high current gain. The total current gain of the Darlington transistor pair is given by the product of the gains of the individual transistors 401, 402.

FIG. 3(*b*) illustrates an embodiment of a Darlington transistor pair having transistors of N-MOS type $Q_6$ and $Q_7$. To turn on the Darlington transistor pair, a turn-on voltage is required which is the sum of the individual turn-on voltages of those Darlington transistors. In FIG. 3(*b*), according to an embodiment, two field effect transistors are used in the Darlington transistor pair wherein a node D is the Darlington node where the source S of the first Darlington transistor 401 is connected to the gate G of the second Darlington transistor 402. The Darlington node D can be used to maintain a DC offset and its stability in operational amplifier circuits. According to an embodiment, Darlington transistor pairs can be made of first and second Darlington transistors 401, 402 of N-type and of first and second Darlington transistors 401, 402 of P-type.

Figure 4:
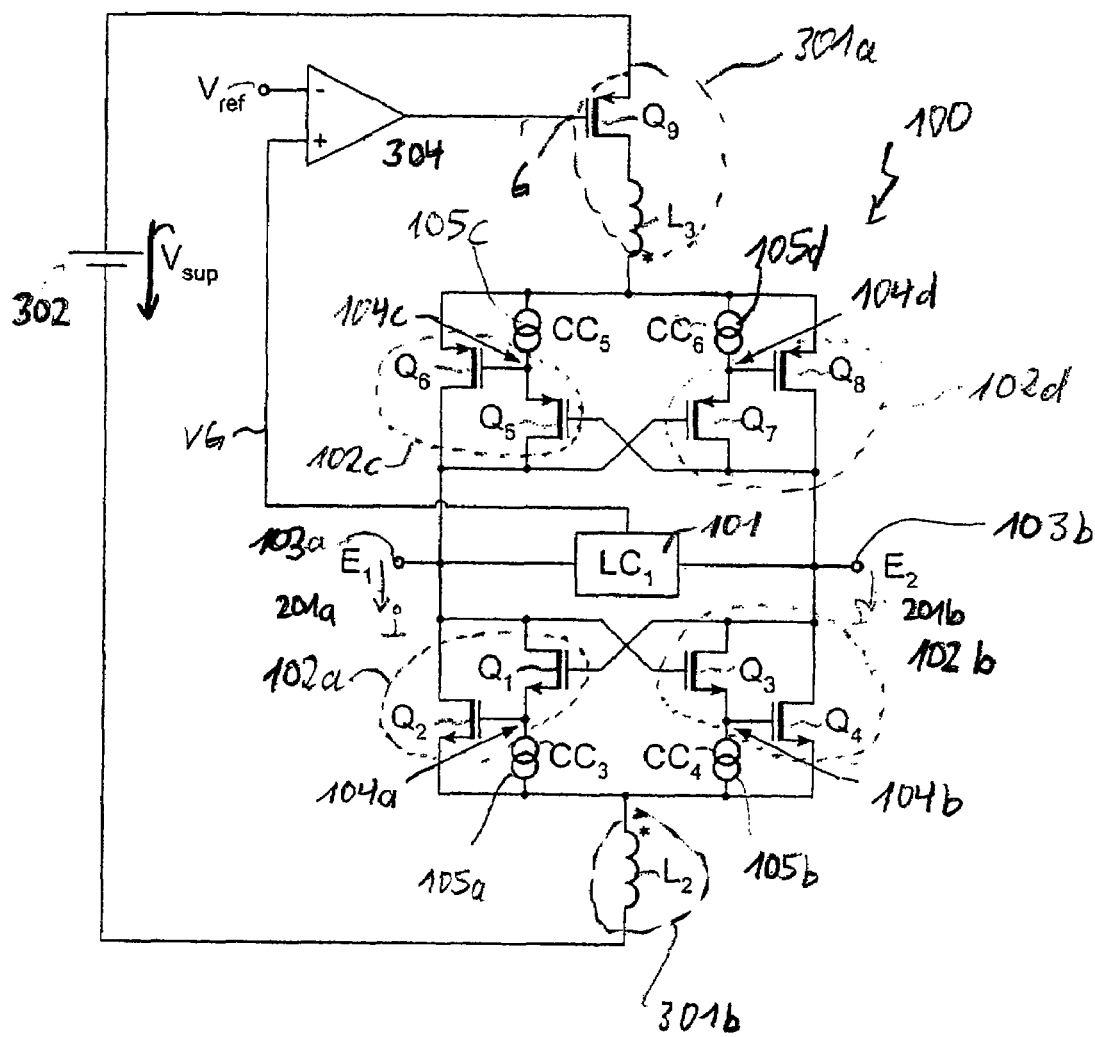
FIG. 4 shows a detailed circuit diagram of a voltage-controlled oscillator according to an embodiment.

In FIG. 4, an embodiment of a circuit configuration is shown in which the amplifying switching units 102*a*-102*d* of FIG. 2 are provided by Darlington transistor pairs, respectively. Thus, the individual switching units 102*a*-102*d* comprise a Darlington transistor pair as described with respect to FIGS. 4(*a*) and 4(*b*). According to an embodiment, the switching units 102*a* and 102*b* comprise first and second N-type Darlington transistors $Q_1$, $Q_2$ and $Q_3$, $Q_4$, respectively. According to an embodiment, the switching units 102*c* and 102*d* comprise first and second Darlington transistors $Q_5$, $Q_6$ and $Q_7$, $Q_8$, respectively.

According to an embodiment, biasing units 105*a*, 105*b*, 105*c* and 105*d* are associated with each Darlington node of a Darlington transistor pair in order to bias a voltage level of the respective Darlington node. In the circuit configuration shown in FIG. 5, according to an embodiment, the biasing units 105*a*-105*d* are provided with current control units. According to an embodiment, the current control units are connected between the respective Darlington node and the source of the second Darlington transistor $Q_2$, $Q_4$, $Q_6$, $Q_8$, respectively.

According to an embodiment, the switching units 102*a*-102*d* are connected in a bridge-like circuit configuration such that a resonance tank core 101 is provided in the bridge diagonal path. The voltage-controlled oscillator 100 depicted in FIG. 5 can be viewed as a first inverter including first and second switching units 102*a*, 102*c* cross-coupled to a second inverter including second switching units 102*b*, 102*d*.

According to an embodiment, the resonance tank core 101 couples the output of each of the inverters back to its input. In one embodiment, the resonance tank core 101 comprises at least one inductor and at least one capacitor. According to an embodiment, preferably, the capacitor is a voltage-tunable device such as a varactor. Furthermore, output terminals 103*a*, 103*b* are provided for outputting output voltage levels 201*a*, 201*b* of the voltage-controlled oscillator 100. Within the resonance tank core 101, virtual ground VG is provided which is connected as one input with the control unit 304 as described with respect to the circuit configuration shown in FIG. 2. According to an embodiment, the current control units 301*a*, 301*b* are provided by discrete circuit elements. According to an embodiment, die current control unit 301*a* is a series connection of a P-type transistor $Q_9$, the gate G of which is connected to the output terminal of the control unit 304 and an inductor $L_3$. According to an embodiment, the other current control unit 301*b* consists of an inductor $L_2$.

The major advantage of using a Darlington transistor pair as a switching unit 102*a*-102*d* is that the first Darlington transistors 401, i.e. the transistors $Q_1$, $Q_3$, $Q_5$ and $Q_7$, may be provided as low-voltage, low-noise and high-speed MOS transistors that provide the main gain in the circuit. The following second Darlington transistors 402, i.e. the transistors $Q_2$, $Q_4$, $Q_6$ and $Q_8$, are the circuit elements which are exposed to the complete voltage stress, i.e. the complete voltage swing, and can be provided as transistors which have a high-voltage breakdown in order to sustain a large voltage swing.

Furthermore, according to an embodiment, it is expedient that the respective Darlington nodes 102*a*-102*d* can be used for supplying biasing conditions for both Darlington transistors, wherein the biasing units 105*a*-105*d* associated with each Darlington node 102*a*-102*d* are multiple transistor current mirrors.

According to an embodiment, it is to be noted that two differential pairs of switching units 102*a*, 102*b* and 102*c*, 102*d*, respectively, are provided, wherein a first pair of switching units 102*a*, 102*b* consists of transistors of a predetermined conductivity type, wherein the other pair of transistors 102*c*, 102*d* consists of the opposite conductivity type. Within each Darlington transistor pair $Q_1$, $Q_2$; $Q_3$, $Q_4$; $Q_5$, $Q_6$ and $Q_7$, $Q_8$, a first Darlington transistor $Q_1$, $Q_3$, $Q_5$, $Q_7$ is a low-voltage high-speed transistor, whereas a second Darlington transistor $Q_2$, $Q_4$, $Q_6$, $Q_8$ is a high-voltage transistor.

The circuit configuration shown in FIG. 4 is supplied by a supply voltage $V_{sup}$ provided by a power supply unit 302. The current provided by the power supply unit 302 is controlled by the respective current control units 301*a*, 301*b* described above.

Figure 5:
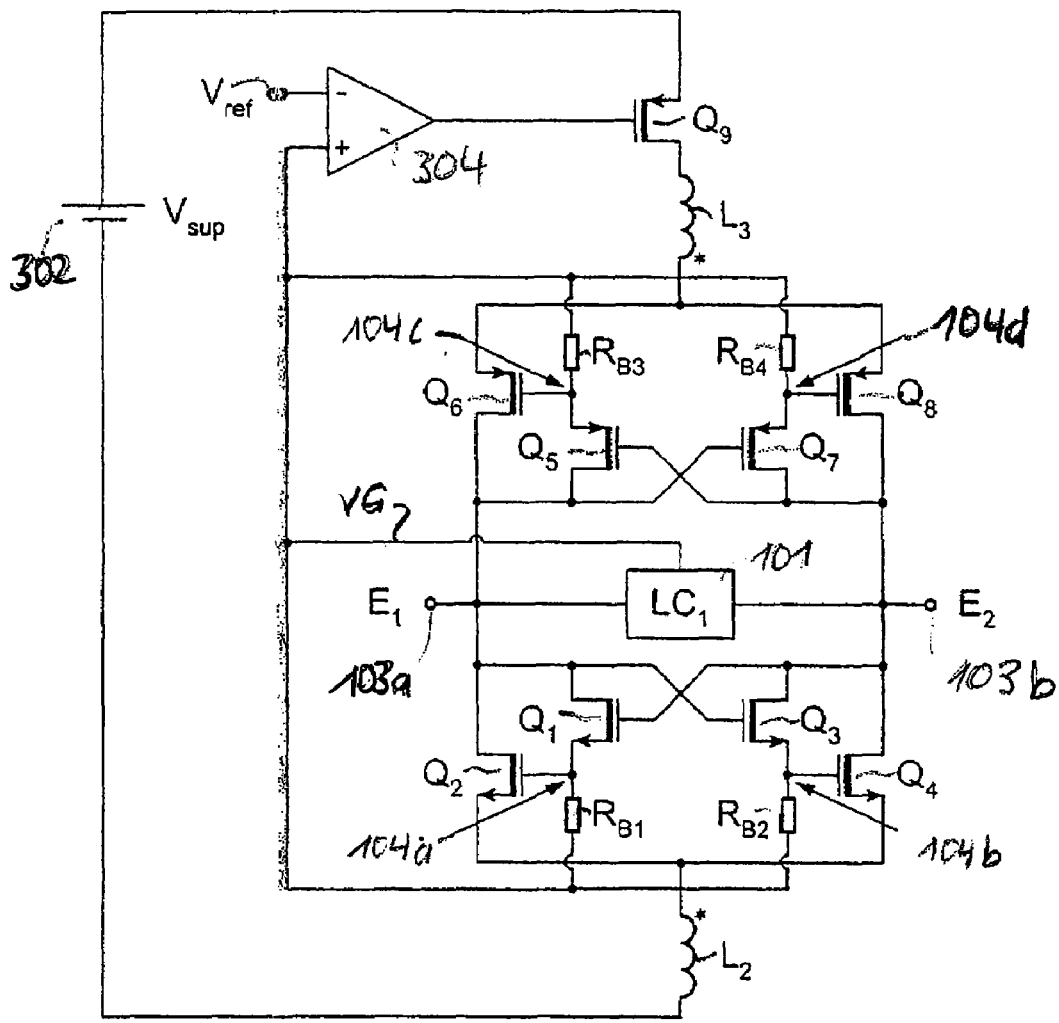
FIG. 5 shows the circuit diagram of FIG. 4 wherein biasing units have been modified such that transistor current mirrors have been replaced by ohmic resistances.

Referring now to FIG. 5, a further embodiment is described. As shown in FIG. 5, the biasing units 105*a*-105*d* which are connected to the respective Darlington nodes 104*a*-104*d* are replaced by resistors $R_{B1}$, $R_{B2}$, $R_{B3}$ and $R_{B4}$, respectively. These resistors are connected between the respective Darlington nodes 104*a*-104*d* and virtual ground VG provided by the resonance tank core 101. The remaining circuit configuration illustrated in FIG. 5 corresponds to the circuit configuration illustrated in FIG. 4.

Figure 6:
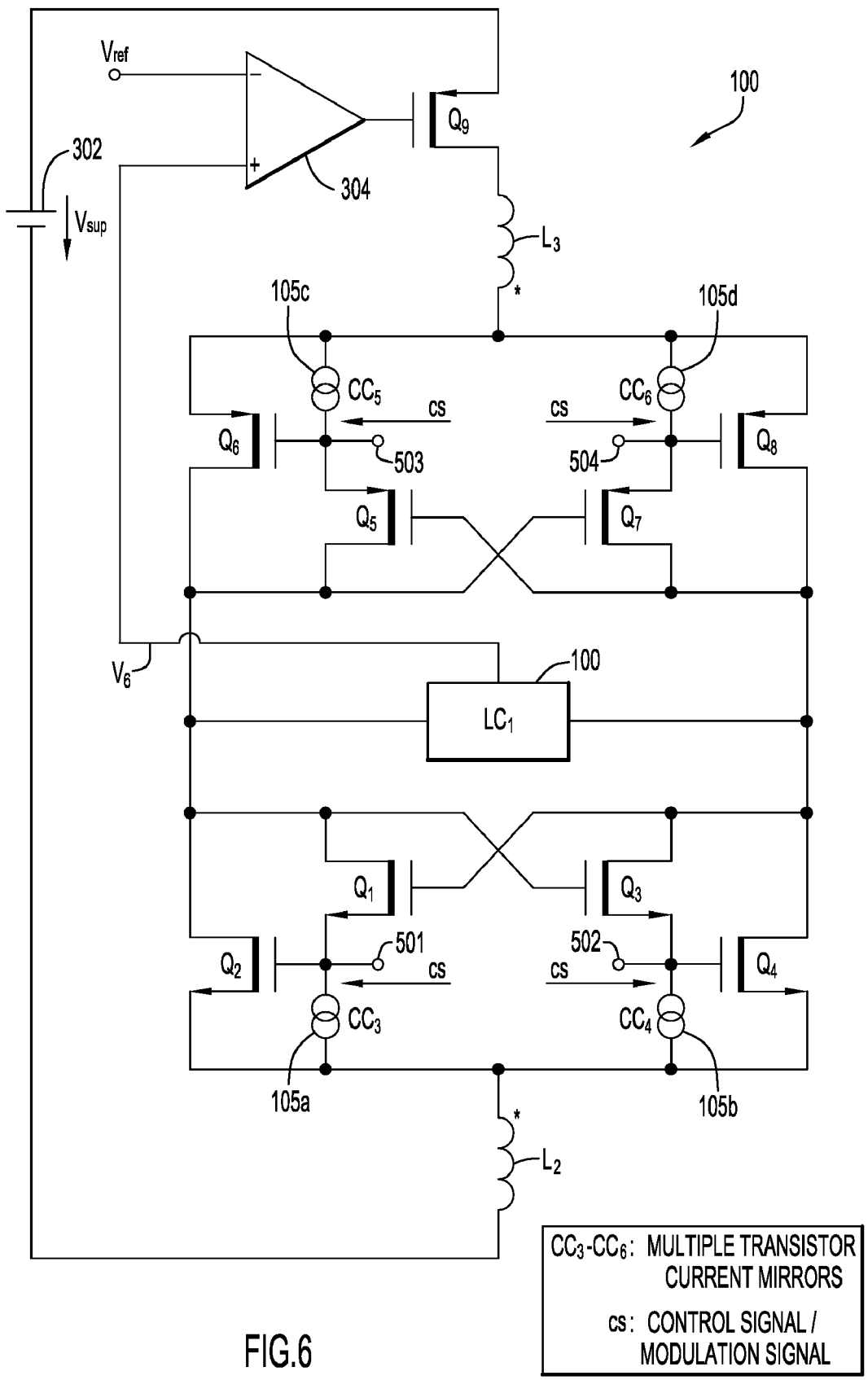
FIG. 6 shows a detailed circuit diagram of another embodiment.

FIG. 6 exhibits a modified circuit configuration as a further embodiment.

It is noted that in order to avoid a redundant description, those parts which have been described with respect to FIG. 4 are not described with respect to FIG. 6 again. The Darlington nodes 104a, 104b, 104c and 104d described with respect to the circuit configuration shown in FIG. 4 are replaced by output terminals 501, 502, 503 and 504, respectively. The remaining circuit configuration shown in FIG. 6 corresponds to the circuit configuration described with respect to FIG. 4.

A major advantage of the circuit configuration shown in FIG. 6 is that the output signal, i.e. output voltage levels, the frequency of which corresponds to the resonance frequency of the resonance tank core 101, can be output without influencing the sensitive resonance tank core 101. Whereas the circuit configuration shown in FIG. 4 includes a direct contact between the output terminals 103a, 103b with the resonance tank core 101, the circuit configuration shown in FIG. 6 avoids a direct connection of output terminals to the resonance tank core 101.

The provision of Darlington nodes by employing a Darlington transistor pair 401, 402 (FIG. 4(a), (b)) as switching units 102a-102d may have further advantages with respect to a design of voltage-controlled oscillators 100 as will be described below. In FIG. 6, it is shown that intermediate output terminals 501, 502, 503, 504 are provided for outputting the output voltage levels, wherein the intermediate output terminals are coupled to a corresponding Darlington node. Furthermore, it is possible to supply additional supply and control signals for low-power mode and/or power-down mode to the voltage-controlled oscillator via the Darlington nodes. Thus, it is possible to control the voltage-controlled oscillator 100 into a low-power and/or power-down mode independent of supply and control signals via the respective Darlington nodes. For example, the operation mode can be adjusted through changing the operating conditions of transistors $Q_2$, $Q_4$, $Q_6$, and $Q_8$. The changing the operating conditions may be affected by adjusting the voltages at the terminals 501, 502, 503, and 504 or by adjusting the currents through the current control units 105a-105d. Thus the power consumption of the oscillator can be controlled.

Furthermore, it can be advantageous to provide a modulation of the voltage-controlled oscillator 100 by supplying modulation signals to the Darlington nodes. According to an embodiment, preferably, the modulation signals provide one of amplitude modulation, frequency modulation and phase modulation of the voltage-controlled oscillator 100. The modulation of the voltage-controlled oscillator 100 may again be affected through changing the operating conditions of transistors $Q_2$, $Q_4$, $Q_6$, and $Q_8$. If, for example, the voltage of terminals 501, 502, 503 and 504 is adjusted, the current through the transistors Q2, Q4, Q6, Q8 is changed as well. If said voltage is continuously varied across time the current would assume a shape, which depends on the change of the voltage. A change in the current translates to a change in the output amplitude of the Oscillator. Thus an amplitude modulator can be realized.

Figure 7:
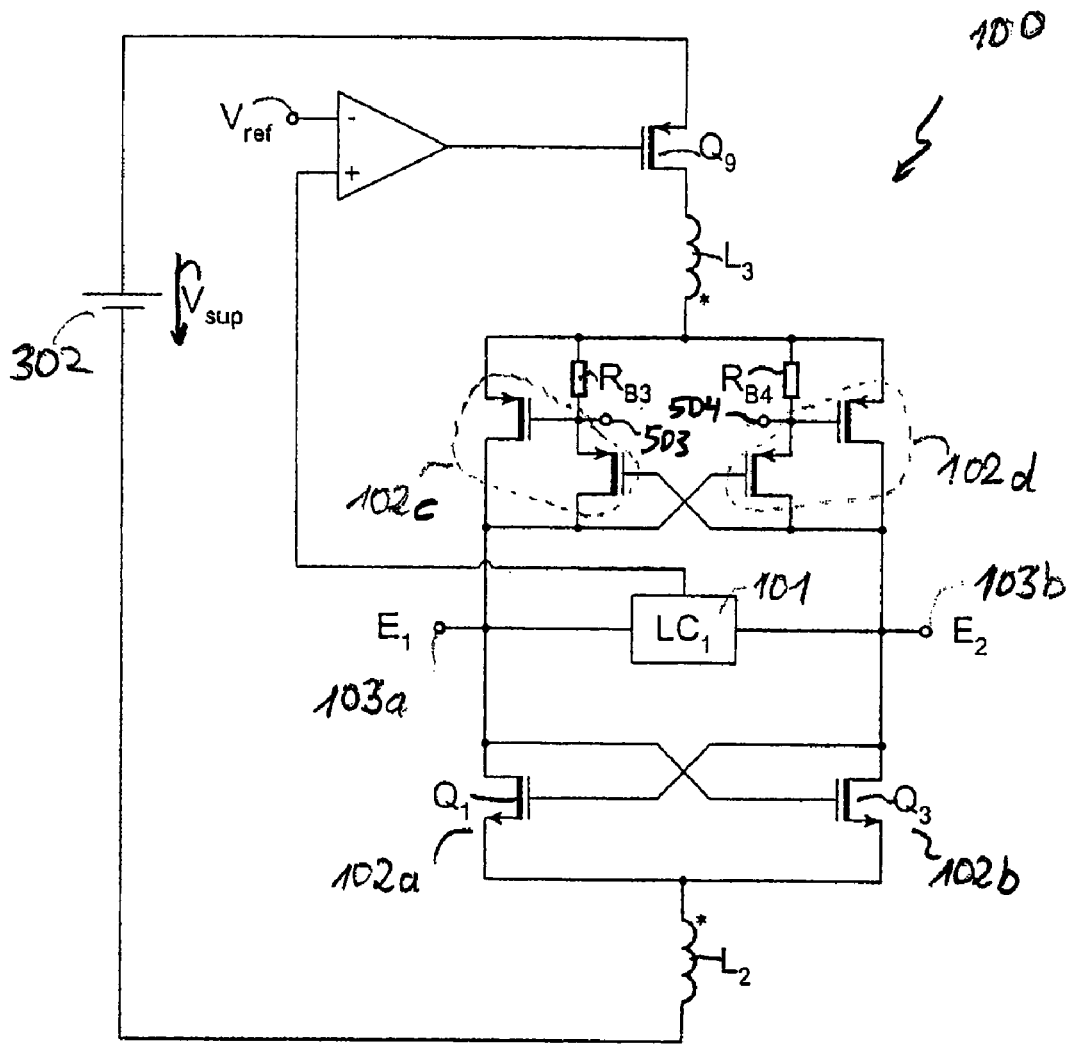
FIG. 7 is a circuit diagram of yet another embodiment.

FIG. 7 shows another circuit configuration according to an embodiment. As shown in FIG. 7, at least two of the switching units 102a, 102b consist of a pair of Darlington transistors which are connected via a Darlington node 503, 504 wherein at least two of further switching units 102c, 102d consist of a CMOS transistor, respectively. The advantage of the circuit configuration shown in FIG. 7 is that the voltage-controlled oscillator 100 oscillates closer to the lower supply rail, i.e. a larger voltage swing can be achieved, if the Darlington transistor pairs of the switching units 102c, 102d shown in FIG. 4 are replaced by a single cross-coupled transistor pair $Q_1$, $Q_3$, respectively.

While embodiments have been shown and described, various modifications and substitutions may be made thereto without departing from the spirit and scope of the invention. Accordingly, it is to be understood that the present invention has been described by way of illustration and not limitation.

Furthermore, the invention is not limited to the specific application areas mentioned above.

What is claimed is:

1. An oscillator, comprising:
    a) a resonance tank core providing a resonance frequency;
    b) two differential pairs of switching units, one pair comprising transistors of a predetermined conductivity type and the other pair comprising transistors of the opposite conductivity type, the switching units being connected to the resonance tank core for changing output voltage levels of the oscillator with a frequency corresponding to the resonance frequency of the resonance tank core, wherein each of the switching units comprises a Darlington-type pair of transistors which are connected via a Darlington node, wherein a first transistor of each Darlington-type pair of transistors is a low voltage high speed transistor, and wherein a second transistor of each pair of transistors is a high voltage transistor; and
    c) output terminals for outputting the output voltage levels.

2. An oscillator according to claim 1, wherein biasing units associated with each Darlington node to bias a voltage level of the respective Darlington node are provided.

3. An oscillator according to claim 2, wherein the biasing units are provided with current control units.

4. An oscillator according to claim 2, wherein the biasing units associated with each Darlington node are multiple transistor current mirrors.

5. An oscillator according to claim 1, wherein the resonance tank core comprises at least one inductor and at least one varactor.

6. An oscillator according to claim 1, wherein at least two of the switching units comprise a CMOS transistor, respectively.

7. An oscillator, comprising:
    a) a resonance tank core providing a resonance frequency;
    b) two differential pairs of switching units, one pair comprising transistors of a predetermined conductivity type and the other pair comprising transistors of the opposite conductivity type, the switching units being connected to the resonance tank core for changing output voltage levels of the oscillator with a frequency corresponding to the resonance frequency of the resonance tank core, wherein each of the switching units comprises a Darlington-type pair of transistors which are connected via a Darlington node;
    c) resistors coupled between the respective Darlington node and virtual ground provided by the resonance tank core; and
    d) output terminals for outputting the output voltage levels.

8. An oscillator according to claim 7, wherein the resonance tank core comprises at least one inductor and at least one varactor.

9. An oscillator according to claim 7, wherein the first transistor of each Darlington-type pair of transistors is a low voltage high speed transistor, and wherein the second transistor of each Darlington-type pair of transistors is a high voltage transistor.

10. An oscillator, comprising:
    a) a resonance tank core providing a resonance frequency;
    b) two differential pairs of switching units, one pair comprising transistors of a predetermined conductivity type and the other pair comprising transistors of the opposite conductivity type, the switching units being connected to the resonance tank core for changing output voltage levels of the oscillator with a frequency corresponding to the resonance frequency of the resonance tank core, wherein each of the switching units comprises a Darlington-type pair of transistors which are connected via a Darlington node, wherein a first transistor of each Darlington-type pair of transistors is a low voltage high speed transistor, and wherein a second transistor of each pair of transistors is a high voltage transistor; and c) output terminals for outputting the output voltage levels wherein the output terminals are coupled to a corresponding Darlington node.

11. An oscillator according to claim 10, wherein biasing units associated with each Darlington node are provided to bias a voltage level of the respective Darlington node.

12. An oscillator according to claim 11, wherein the biasing units are provided with current control units.

13. An oscillator according to claim 11, wherein the biasing units associated with each Darlington node are multiple transistor current mirrors.

14. An oscillator according to claim 10, wherein the resonance tank core comprises at least one inductor and at least one varactor.

15. A method of using an oscillator, said oscillator comprises:
   a) a resonance tank core providing a resonance frequency;
   b) two differential pairs of switching units, one pair comprising transistors of a predetermined conductivity type and the other pair comprising transistors of the opposite conductivity type, the switching units being connected to the resonance tank core for changing output voltage levels of the oscillator with a frequency corresponding to the resonance frequency of the resonance tank core, wherein each of the switching units comprises a Darlington-type pair of transistors which are connected via a Darlington node, wherein a first transistor of each Darlington-type pair of transistors performs switching at low voltage and high speed, and wherein a second transistor of each Darlington-type pair of transistors performs switching at high voltage; and
   c) output terminals for outputting the output voltage levels, wherein a control signal for low power mode and/or power-down mode is supplied to the oscillator via the Darlington nodes.

16. A method according to claim 15, wherein biasing units associated with each Darlington node are provided to bias a voltage level of the respective Darlington node.

17. A method according to claim 16, wherein the biasing units are provided with current control units.

18. A method according to claim 16, wherein the biasing units associated with each Darlington node function as multiple transistor current mirrors.

19. A method of using an oscillator, said oscillator comprises:
   a) a resonance tank core providing a resonance frequency;
   b) two differential pairs of switching units, one pair comprising transistors of a predetermined conductivity type and the other pair comprising transistors of the opposite conductivity type, the switching units being connected to the resonance tank core for changing output voltage levels of the oscillator with a frequency corresponding to the resonance frequency of the resonance tank core, wherein each of the switching units comprises a Darlington type pair of transistors which are connected via a Darlington node, wherein a first transistor of each Darlington-type pair of transistors performs switching at low voltage and high speed, and wherein a second transistor of each Darlington-type pair of transistors performs switching at high voltage; and
   c) output terminals for outputting the output voltage levels, wherein the oscillator is modulated by supplying a modulation signal to the Darlington nodes.

20. A method according to claim 19, wherein biasing units associated with each Darlington node are provided to bias a voltage level of the respective Darlington node.

21. A method according to claim 20, wherein the biasing units are provided with current control units.

22. A method according to claim 20, wherein the biasing units associated with each Darlington node function as multiple transistor current mirrors.

23. A method according to claim 19, wherein the modulation signal provides one of amplitude modulation, frequency modulation and phase modulation of the oscillator.

24. An oscillator, comprising:
   a) a resonance tank core providing a resonance frequency;
   b) switching units connected to the resonance tank core for changing output voltage levels of the oscillator with a frequency corresponding to the resonance frequency of the resonance tank core, wherein at least two of the switching units comprise a Darlington-type pair of transistors which are connected via a Darlington node, wherein a first transistor of each Darlington-type pair of transistors is a low-voltage, high-speed transistor, and wherein a second transistor of each Darlington-type pair of transistors is a high-voltage transistor; and
   c) output terminals for outputting the output voltage levels.

* * * * *